(12) United States Patent
Asano et al.

(10) Patent No.: US 8,031,328 B2
(45) Date of Patent: Oct. 4, 2011

(54) POSITIONING APPARATUS

(75) Inventors: Tosiya Asano, Utsunomiya (JP); Yugo Shibata, Utsunomiya (JP); Atsushi Kimura, Funabashi (JP)

(73) Assignee: Canon Kabushiki Kaisha, Tokyo (JP)

( * ) Notice: Subject to any disclaimer, the term of this patent is extended or adjusted under 35 U.S.C. 154(b) by 941 days.

(21) Appl. No.: 11/339,896

(22) Filed: Jan. 26, 2006

(65) Prior Publication Data
US 2006/0175910 A1 Aug. 10, 2006

(30) Foreign Application Priority Data

Feb. 9, 2005 (JP) ................................ 2005-033017

(51) Int. Cl.
*G03B 27/58* (2006.01)
*H02K 41/02* (2006.01)

(52) U.S. Cl. .................. 355/72; 310/12.21; 310/12.24

(58) Field of Classification Search ............... 355/72, 355/75; 310/12, 13
See application file for complete search history.

(56) References Cited

U.S. PATENT DOCUMENTS

| | | | |
|---|---|---|---|
| 5,015,866 A | | 5/1991 | Hayashi |
| 5,196,745 A | * | 3/1993 | Trumper .................. 310/12 |
| 5,925,956 A | * | 7/1999 | Ohzeki .................. 310/90.5 |
| 6,072,251 A | * | 6/2000 | Markle .................. 310/12 |
| 6,188,150 B1 | * | 2/2001 | Spence .................. 310/12.17 |
| 6,208,407 B1 | | 3/2001 | Loopstra |
| 6,252,234 B1 | * | 6/2001 | Hazelton et al. ........ 250/442.11 |
| 6,259,174 B1 | * | 7/2001 | Ono .................. 310/13 |
| 6,285,444 B1 | | 9/2001 | Osanai et al. |
| 6,353,271 B1 | * | 3/2002 | Williams .................. 310/12 |
| 6,414,742 B1 | | 7/2002 | Korenaga |
| 6,445,093 B1 | | 9/2002 | Binnard |
| 6,452,292 B1 | * | 9/2002 | Binnard .................. 310/12 |
| 6,819,433 B2 | * | 11/2004 | Takai et al. ............. 356/500 |
| 6,992,755 B2 | * | 1/2006 | Kubo .................. 355/72 |
| 7,064,808 B1 | * | 6/2006 | Gilissen et al. .......... 355/72 |
| 7,782,444 B2 | * | 8/2010 | Kimura .................. 355/72 |
| 2001/0000974 A1 | * | 5/2001 | Hazelton et al. .......... 355/53 |
| 2004/0126907 A1 | | 7/2004 | Korenaga |

FOREIGN PATENT DOCUMENTS

| | | |
|---|---|---|
| JP | 02-153519 A | 6/1990 |
| JP | 11-097513 | 4/1999 |
| JP | 11-190786 | 7/1999 |
| JP | 2000-039305 | 2/2000 |
| JP | 2001-143997 A | 5/2001 |
| JP | 2001-510577 A | 7/2001 |
| JP | 2002-112526 | 4/2002 |
| JP | 2002-319541 | 10/2002 |
| JP | 2004-254489 | 9/2004 |
| JP | 2005-020030 A | 1/2005 |

* cited by examiner

*Primary Examiner* — Hung Henry Nguyen
*Assistant Examiner* — Steven H Whitesell Gordon
(74) *Attorney, Agent, or Firm* — Canon USA Inc IP Division

(57) ABSTRACT

A positioning apparatus includes a moving member, an actuator, and a controller. The moving member can move in at least a first direction. The actuator is provided along the first direction. The controller controls a current applied to the actuator in order to support the weight of the moving member. The bending rigidity of the moving member in the first direction is greater than the bending rigidity of the moving member in a second direction perpendicular to the first direction.

2 Claims, 10 Drawing Sheets

POSITIONING APPARATUS

BACKGROUND OF THE INVENTION

1. Field of the Invention

The present invention relates to a positioning apparatus, and more specifically, it relates to a positioning apparatus used for positioning a substrate in a photolithography machine.

2. Description of the Related Art

A semiconductor photolithography machine makes exposure light incident on an original pattern drawn on a reticle. The light transmitted or reflected by the reticle is reduced with an exposure optical system, and the reduced pattern is projected onto a semiconductor substrate (wafer). In this way, a semiconductor photolithography machine performs exposure operation. The reticle having the pattern to be transferred is mounted on a reticle stage and positioned at a predetermined position. The reticle is irradiated from above with exposure light by an illumination system. The exposure light then enters a reduced projection optical system. This optical system forms an image at a predetermined position. A wafer stage carries and positions a wafer such that a predetermined area on the wafer is positioned at the point where the image is formed. The positional information of the wafer relative to the wafer stage has been obtained in advance by measuring the position of an alignment mark on the wafer with an alignment optical system. When exposure is performed, the wafer is positioned at the predetermined position on the basis of this alignment information.

Throughput is one of the indicators of the performance of a photolithography machine. The throughput is expressed as the number of wafers that the photolithography machine can process per unit time. In order to increase the throughput, it is necessary to move the wafer stage in a short time. For this purpose, it is necessary to increase the moving velocity in addition to the acceleration and deceleration when the wafer stage is moved. In order to achieve high acceleration and deceleration, high moving velocity, and highly accurate positioning performance, conventional wafer stages generally have a coarse/fine-motion multistep configuration including a fine-motion stage and a coarse-motion stage. The fine-motion stage carries and positions a wafer with high accuracy. The coarse-motion stage moves the fine-motion stage in the horizontal direction at high acceleration and deceleration and high moving velocity. In this configuration, a coarse-motion actuator needs to accelerate and decelerate the combined mass of the coarse-motion stage and the fine-motion stage. The higher the acceleration, the greater the necessary thrust. Consequently, the coarse-motion actuator tends to be large, and the entire stage apparatus also tends to be large. This tendency is undesirable because it causes an increase in the production cost and an increase in the area for installing the apparatus.

In addition, recently, a twin-stage configuration has been proposed. In the twin-stage configuration, while a wafer on one stage is exposed, another wafer to be exposed next is mounted on the other stage and aligned. In the twin-stage configuration, two stages individually convey wafers, and each stage repeats a cycle of wafer mounting, alignment operation, exposure operation, and wafer pickup. Therefore, the two stages use a common alignment optical system, exposure optical system, and wafer exchanger at different times. In the case of the conventional coarse/fine-motion stage, a complex configuration is necessary to interchange positions of two stages.

To solve this problem, a surface-motor stage has been devised. FIGS. 15A and 15B show a surface-motor stage apparatus that can perform positioning in six directions by Lorentz force (see Japanese Patent Laid-Open No. 2004-254489, corresponding to US Patent Application No. 2004-126907).

The stage apparatus includes a stage (mover) 110 and a coil unit (stator) 100. The stage 110 has a magnet unit 114 on the underside. The coil unit 100 faces the magnet unit 114. The magnet unit 114 includes a plurality of permanent magnets. The plurality of permanent magnets are arranged in the XY direction in a so-called Halbach array. The coil unit 100 includes a plurality of coils. The coil unit 100 includes a layer 116a of coils arranged in the X direction and a layer 116b of coils arranged in the Y direction. Although not shown in FIG. 15A, the coil unit 100 further includes another layer of coils arranged in the X direction and another layer of coils arranged in the Y direction. By selectively applying a current to these coil layers, a Lorentz force is generated between the magnet unit 114 and the coil unit 100, and consequently the stage 110 can be moved.

Using the coil layer 116a, a thrust in the X direction is given to the stage 110. Using the coil layer 116b, a thrust in the Y direction is given to the stage 110. Using the other coil layers, thrusts in the Z direction (vertical direction), θx direction (rotating direction around the X axis), θy direction (rotating direction around the Y axis), and θz direction (rotating direction around the Z axis) are given to the stage 110. The weight of the stage 110 is supported by the coil layers that give the stage 110 the thrust in the Z direction.

The coils constituting each coil layer generate desired forces in pairs. Each pair of coils (a phase A coil and a phase B coil) is adjacent to each other. The magnet unit 114 has cyclic (for example, sine-wave) magnetic-flux-density distributions in the X direction and the Y direction. Therefore, when a certain current is applied to the phase A coils, the generated thrust is a sine wave whose argument is a position of the magnet unit 114 relative to the coil unit 100. The magnet unit 114 and the coil unit 100 are arranged such that, when a certain current is applied to the phase B coils, the generated thrust is a sine wave that is out of phase with the thrust of the phase A coils by 90 degrees. Therefore, by obtaining a rectification value from the position of the magnet unit 114 relative to the coil unit 100 and applying a current multiplied by the rectification value to the phase A coils and the phase B coils, desired forces can be generated.

However, in the case where the weight of the stage is supported using coils arranged in the X direction (or the Y direction), the application points of the forces applied to the stage to support the weight of the stage change as the stage moves in the X direction (or the Y direction). That is to say, when the stage is at a position, only the phase A coils apply forces to the stage; when the stage is at another position, only the phase B coils apply forces to the stage; and when the stage is at yet another position, both phase A coils and phase B coils apply forces to the stage. Such change in the application points of forces can cause undesirable deformation of the stage.

In photolithography machines, in general, a laser interferometer is used for measuring the position of a stage. A reflecting surface (mirror) is provided in the stage. The laser interferometer measures the position of the reflecting surface (mirror) by irradiating the reflecting surface (mirror) with laser light. Therefore, the positional relationship between the reflecting surface (mirror) and the exposed area on the wafer must be fixed. If the above-described deformation occurs, the positional relationship between the reflecting surface (mirror)

and the exposure area on the wafer changes and therefore the exposure accuracy deteriorates.

SUMMARY OF THE INVENTION

The present invention is directed to a positioning apparatus.

In an aspect of the present invention, a positioning apparatus includes a moving member, an actuator, and a controller. The moving member can move in at least a first direction. The actuator is provided along the first direction. The controller controls a current applied to the actuator in order to support the weight of the moving member. The bending rigidity of the moving member in the first direction is greater than the bending rigidity of the moving member in a second direction perpendicular to the first direction.

In another aspect of the present invention, a positioning apparatus includes a moving member, an actuator, and a controller. The moving member can move in at least a first direction. The actuator is provided along the first direction. The controller controls a current applied to the actuator in order to support the weight of the moving member. The controller controls the current so as to reduce the bending force exerted on the moving member as the moving member moves in the first direction.

In another aspect of the present invention, a positioning apparatus includes a moving member, an actuator, and a controller. The moving member can move in at least a first direction. The actuator is provided along the first direction. The controller controls a current applied to the actuator in order to support the weight of the moving member. The controller controls the current so as to reduce an amount of deformation of the moving member as the moving member moves in the first direction. The amount of deformation of the moving member is obtained in advance.

In another aspect of the present invention, a positioning apparatus includes a moving member, an actuator, a controller, an interferometer, and a mirror. The moving member can move in at least a first direction. The actuator is provided along the first direction. The controller controls a current applied to the actuator in order to support the weight of the moving member. The interferometer measures the position of the moving member in a direction of gravitational force. The mirror is provided in the moving member and reflects light from the interferometer. The mirror is provided along the first direction.

This configuration can reduce the effect of the deformation caused by the change in the application point of force when the stage moves.

The positioning apparatus of the present invention can be applied to not only the photolithography machines and device-manufacturing machines, which are described as the embodiments, but also various high-precision processing machines and various high-precision measuring machines.

Further features of the present invention will become apparent from the following description of exemplary embodiments (with reference to the attached drawings).

DESCRIPTION OF THE EMBODIMENTS

Embodiment 1

Figure 1:
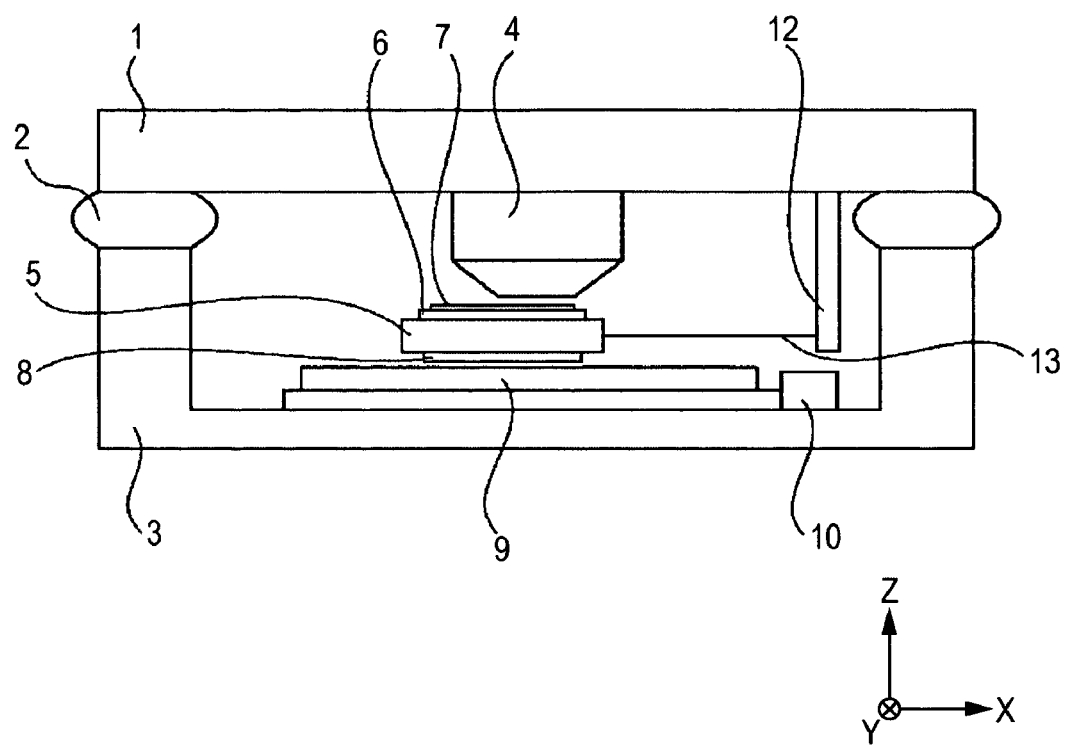
FIG. 1 is a schematic view of a photolithography machine.

FIG. 1 is a schematic view of a semiconductor photolithography machine. A lens barrel supporting member 1 is mounted on a mount 3. The lens barrel supporting member 1 is insulated with a vibration absorber 2 so as to be insulated against vibrations from the floor. A projection optical system 4 is supported by the lens barrel supporting member 1. A reticle stage (not shown) is provided above the projection optical system 4. A wafer stage 5 is provided below the projection optical system 4.

A wafer 7 is mounted on the wafer stage (mover) 5 with a wafer chuck 6. The wafer stage 5 can be moved with a so-called surface motor. The surface motor includes a magnet unit 8 and a coil unit (stator) 9. The magnet unit 8 is provided on the underside of the wafer stage 5. The coil unit 9 is provided on the mount 3. The surface motor will hereinafter be described in detail.

When the wafer stage 5 is driven, a reaction force is exerted on the coil unit 9. In order to prevent the reaction force from being transmitted to the mount 3, the coil unit 9 can move on the mount 3 in the XY direction. Such configuration is discussed in Japanese Patent Laid-Open No. 11-190786 (corresponding to U.S. Pat. No. 6,414,742).

In order to measure the position of the coil unit 9 relative to the mount 3, a linear encoder that measures the position of the coil unit 9 in the X direction and the Y direction is provided. The coil unit 9 is driven by a linear motor 10 relative to the mount 3 in the X direction and the Y direction. Means for driving the coil unit 9 is not limited to a linear motor.

The position of the wafer stage 5 is measured with a laser interferometer 12. A mirror (not shown) is provided in the wafer stage 5. The laser interferometer 12 measures the position of the wafer stage 5 by making laser light 13 reflect from the surface of the mirror.

Figure 2:
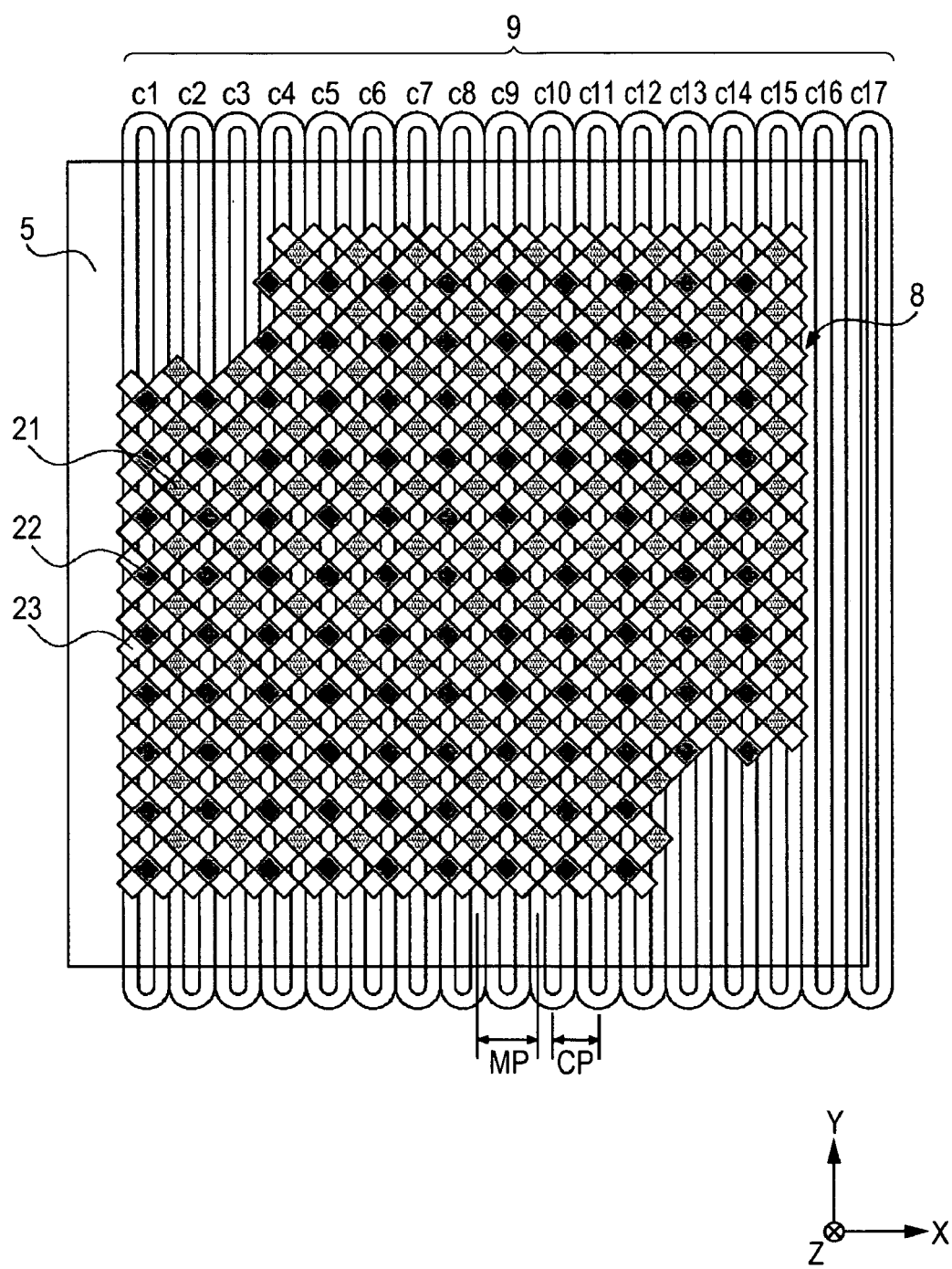
FIG. 2 shows the arrangement of movable magnets in a surface-motor stage.
Figure 15A:
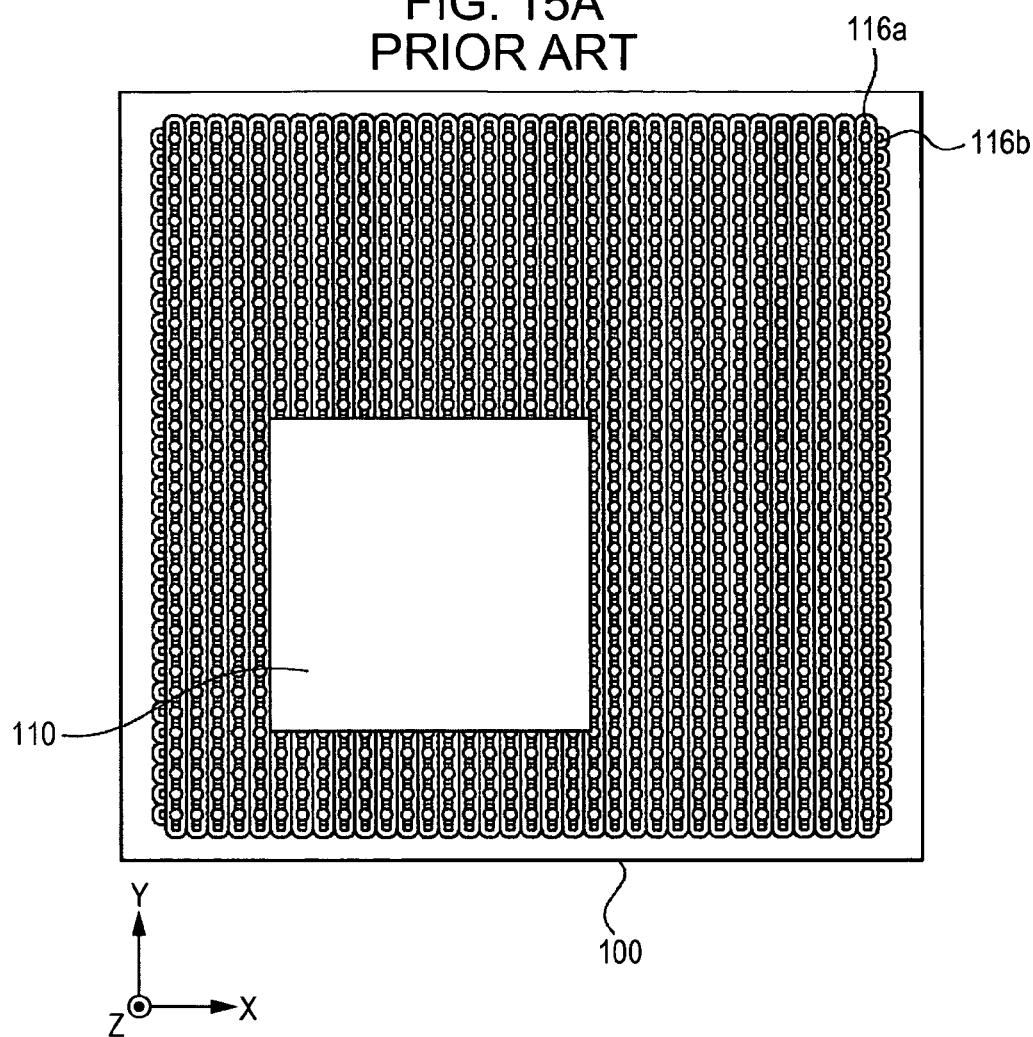
FIGS. 15A and 15B show an entire surface motor.
Figure 15B:
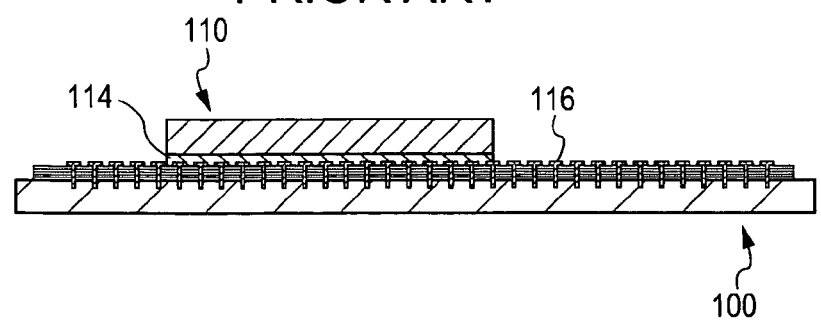

FIG. 2 illustrates the surface motor. FIG. 2 shows the magnet arrangement in the magnet unit 8 viewed from above through the wafer stage 5 in FIG. 1. Of coil layers in the coil unit 9, only a coil layer in which coils are arranged in the X direction is shown. The coil unit 9 shown in FIG. 2 is simplified. In the real coil unit 9, the number of coils is larger and the length of coils is longer than one shown in FIG. 2 as shown in FIGS. 15A and 15B.

Magnets 21 (shown in light gray) and magnets 22 (shown in dark gray) are main pole magnets polarized in the vertical direction (Z direction). The magnets 21 have the south pole on the −Z side (the side facing the coil unit 9). The magnets 22 have the north pole on the −Z side. Magnets 23 (shown in white) are auxiliary pole magnets polarized in the horizontal direction. The ends of each auxiliary pole magnet 23 are in contact with the main pole magnets. The pole at an end of each auxiliary pole magnet corresponds to the pole on the −Z side of the main pole magnet that is in contact with the end of the auxiliary pole magnet. Such a magnet arrangement is called a Halbach array. The magnet unit 8 has a cyclic magnetic-flux-density distribution on the −Z side. In the magnet unit 8, a plurality of magnets are arranged in the XY direction in the Halbach array. The plurality of magnets are arranged symmetrically in a substantially square pattern in the XY direction.

The coil unit 9 includes a plurality of coils. The coil unit 9 includes a layer of coils arranged in the X direction and a layer of coils arranged in the Y direction. In the coil unit 9, coils are arranged in a grid pattern. By selectively applying a current to these coils, Lorentz force is generated between the magnet unit 8 and the coil unit 9, and consequently the wafer stage 5 can be moved.

The current applied to the coils will be described. A coil pitch CP is the distance between two adjacent coils. A magnetic-pole pitch MP is the distance between magnets having the same pole (main pole magnets having the same pole on the −Z side). There is the following relationship between the coil pitch CP and the magnetic-pole pitch MP:

$$MP=4/3*CP \quad (1)$$

In the state of FIG. 2, the positional coordinate x in the X direction of the stage is zero. Let us suppose that the positional coordinate x is greater than or equal to zero and less than CP. The coils used for driving the stage in the X direction are c6 to c11. These coils c6 to c11 do not overlap with the magnetless portions on the upper-left and lower-right corners of the magnet unit 8. The winding direction of the coils is clockwise in FIG. 2.

As described above, the magnet unit 8 forms a magnetic-flux-density distribution above the coils. If the average value of the magnetic-flux-density distribution in the Z direction can be approximated by a sine wave with respect to the X axis, the force fi (i=6 to 11) in the X direction generated when a current I [A] is applied to coils ci (i=6 to 11) is described by the following functions of positional coordinate x. Since the coil unit 9 moves as described above, variable x in the trigonometric functions in the following equations needs to be corrected using the measurement value obtained in the measurement of the position of the coil unit 9. Here, to simplify the explanation, this correction is omitted.

$$f6, f10 = -I*Kx*\cos(2*\pi/MP*x) \quad (2)$$

$$f8 = I*Kx*\cos(2*\pi/MP*x) \quad (3)$$

$$f7, f11 = I*Kx*\sin(2*\pi/MP*x) \quad (4)$$

$$f9 = -I*Kx*\sin(2*\pi/MP*x) \quad (5)$$

Here, Kx is a constant.

When the phase is the same as the above functions and the current Ii (i=6 to 11) applied to the coil ci (i=6 to 11) is $$I6, I10 = -I*\cos(2*\pi/MP*x) \quad (6)$$

$$I8 = I*\cos(2*\pi/MP*x) \quad (7)$$

$$I7, I11 = I*\sin(2*\pi/MP*x) \quad (8)$$

$$I9 = -I*\sin(2*\pi/MP*x) \quad (9)$$

each of the sums of forces (f6+f7), (f8+f9), and (f10+f11) is $$I*Kx*\cos{}^2(2*\pi/MP*x) + I*Kx*\sin{}^2(2*\pi/MP*x) = 1*Kx \quad (10)$$

and therefore the total thrust F is 3*I*Kx. That is to say, the current I required for generating a force F is obtained from the following equation:

$$I = F/Kx/3 \quad (11)$$

When the positional coordinate x is greater than or equal to −CP and less than zero, coils c5 to c10 are used. In this case, currents I6 to I10 according to equations (6) to (9) are applied to coils c6 to c10, respectively. As for coil 5, current I9 according to equation (9) is applied. Each of the sums of forces (f5+f6), (f7+f8), and (f9+f10) is thus expressed by equation (10).

Since the coils are arranged at intervals of CP, in the case where the stage moves by the distance CP, the positional relationship between the magnet unit 8 and the coil unit 9 is the same except for that the coil numbers differ by one, and therefore the current I for generating force F is obtained from equation (11) as discussed above. That is to say, at whatever position above the coil unit 9 the stage is located, the currents applied to coils in order to generate a desired driving force F in the X direction are obtained by multiplying the current of equation (11) by the rectification values of equations (6) to (9).

Here, the rectification values for the currents applied to coils according to equations (6) and (9) have a negative sign. However, if the direction of the corresponding coils is reversed, the negative sign is unnecessary. Therefore, in the case of even-numbered coils, the current is multiplied by a rectification value according to the cosine function of equation (7), and in the case of odd-numbered coils, the current is multiplied by a rectification value according to the sine function of equation (8).

In this way, the stage 5 can be moved in the X direction. Although not shown in FIG. 2, the stage 5 can be moved in the Y direction using a layer of coils arranged in the Y direction.

In order to generate a moment force in the θz direction, the coils located under the magnetless portions of the magnet unit 8 are used. When the positional coordinate x is greater than or equal to zero and less than CP, a force is generated with (f2, f3) and (f14, f15). When the positional coordinate x is greater than or equal to −CP and less than zero, a force is generated with (f1, f2) and (f13, f14). In these cases, since the magnet unit 8 has the magnetless portions as shown in FIG. 2, the thrust position is displaced in the Y direction. By generating forces in different directions with the above groups, a moment force in the θz direction can be generated.

In the case where a driving force in the Z direction is generated, when the positional coordinate x is greater than or equal to zero and less than CP, groups (f5, f6), (f7, f8), (f9, f10), and (f11, f12) are used, and when the positional coordinate x is greater than or equal to −CP and less than zero, groups (f4, f5), (f6, f7), (f8, f9), and (f10, f11) are used. The magnet unit 8 forms a magnetic-flux-density distribution in the X direction above the coils. The average value of the magnetic-flux-density distribution can be approximated by a sine wave with respect to the X axis. Considering that the direction of the even-numbered coils c2, c6, c10 ... is opposite from the direction of the odd-numbered coils c1, c5, c9 ..., the force f generated in the Z direction when a current of I [A] is applied to each coils is obtained from the following equations:

$$fn = I*Kz*\cos(2*\pi/MP*x) \quad n: \text{odd number} \quad (12)$$

$$fm = -I*Kz*\sin(2*\pi/MF*x) \quad m: \text{even number} \quad (13)$$

When the phase is the same as the above functions and the currents applied to the coils are $$In = I*\cos(2*\pi/MP*x) \quad n: \text{odd number} \quad (14)$$

$$Im = -I*\sin(2*\pi/MP*x) \quad m: \text{even number} \quad (15)$$

the sum of forces of the above four groups is obtained from the following equation:

$$Fz = 4*I*Kz \quad (16)$$

Therefore, the current I required for generating a desired magnitude of force in the Z direction (Fz) is obtained from the following equation:

$$I = Fz/Kz/4 \quad (17)$$

To generate a moment force in the θy direction, the four groups of coils used for generating the force in the Z direction are used. Of the four groups, two groups located on the +X side and two groups located on the −X side generate a couple of forces. In the same way, a moment force in the θx direction can be generated.

In this way, any magnitude of force can be generated in six directions X, Y, Z, θx, θy, and θz. The force in the X direction and the forces in the Z and θy directions may be generated with the same layer of coils. Alternatively, the force in the X direction and the forces in the Z and θy directions may be generated with different layers of coils. The same applies to the force in the Y direction and the forces in the Z and θx directions. Therefore, it is necessary for the coil unit 9 to have at least two layers of coils, that is to say, a layer of coils arranged in the X direction and a layer of coils arranged in the Y direction.

As described above, the position of the stage is measured with the laser interferometer 12. This measurement value is used as a feedback signal for position control of the stage. In addition, this measurement value is used for calculating the phase of the current. The position of the stage in the Z direction is also measured using another laser interferometer (not shown).

The measured positional information of the stage is input into a position controller (not shown). In the position controller, a driving command to be sent to the stage is generated from a position command and the stage-position measurement information. On the basis of the driving command, using the above-described current command method, predetermined currents are applied to the coils with a current driver (not shown). In this way, positioning control of the stage is performed.

The application points of forces for supporting the weight of the wafer stage 5 in the above-described positioning apparatus will be described. The weight of the wafer stage 5 is supported by the thrust in the Z direction generated by applying currents to coils arranged in the X direction. At this time, if the wafer stage 5 moves in the X direction, the application points of forces change depending on the positional relationship between the magnet unit 8 and the coil unit 9.

FIGS. 3A to 3G show a group of coils (c4 to c12) that generate forces supporting the weight of the wafer stage 5, and the magnet unit 8 viewed from the Y direction. The positions (application points) and magnitudes of the forces in the Z direction generated by the group of coils (c4 to c12) are shown by arrows. FIGS. 3A to 3G show the process of movement of the wafer stage 5.

Of the magnets in the magnet unit 8, only the main pole magnets 21 (shown in gray) and 22 (shown in white) that generate forces in the Z direction are shown so as to clarify the arrangement in the X direction. The group of coils (c4 to c12) extends in the direction perpendicular to the drawings (Y direction) and are arranged in the X direction. The even-numbered coils are shown in gray, and the odd-numbered coils are shown in white. On the basis of the above equations (12) to (15), when the stage is located at a position x, the odd-numbered coils generate forces in proportion to square of the cosine of (2*π/MP*x), and the even-numbered coils generate forces in proportion to square of the sine of (2*π/MP*x).

Figure 4:
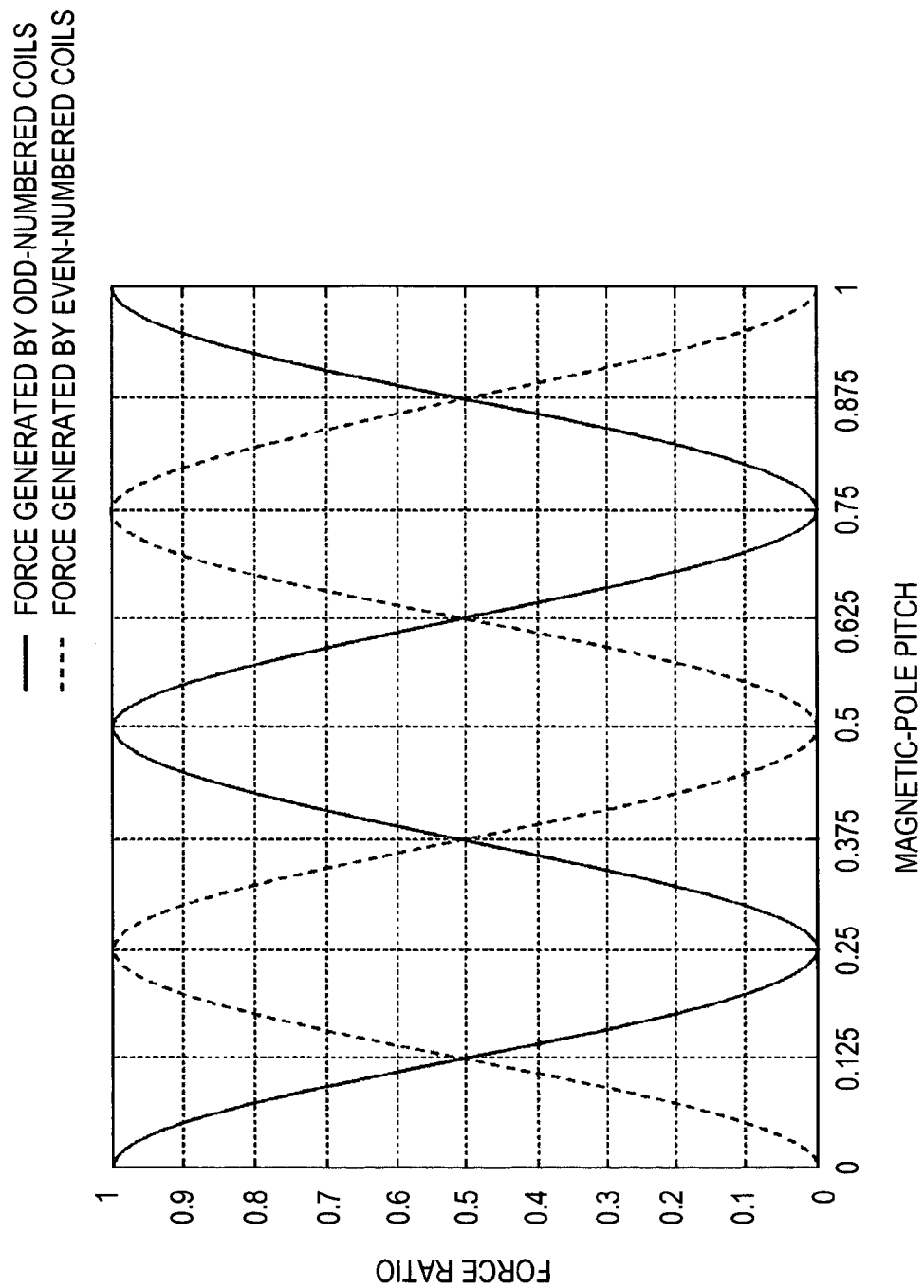
FIG. 4 shows the ratio between the force generated by the odd-numbered coils and the force generated by the even-numbered coils.

FIG. 4 shows the relationship between the stage position and the ratio between the forces generated by the odd-numbered coils and the forces generated by the even-numbered coils. The horizontal axis represents the stage position. The stage position is converted into magnetic-pole pitch. When the stage position x is zero, the magnetic-pole pitch is zero. When the stage position x is MP, the magnetic-pole pitch is one.

Figure 3:
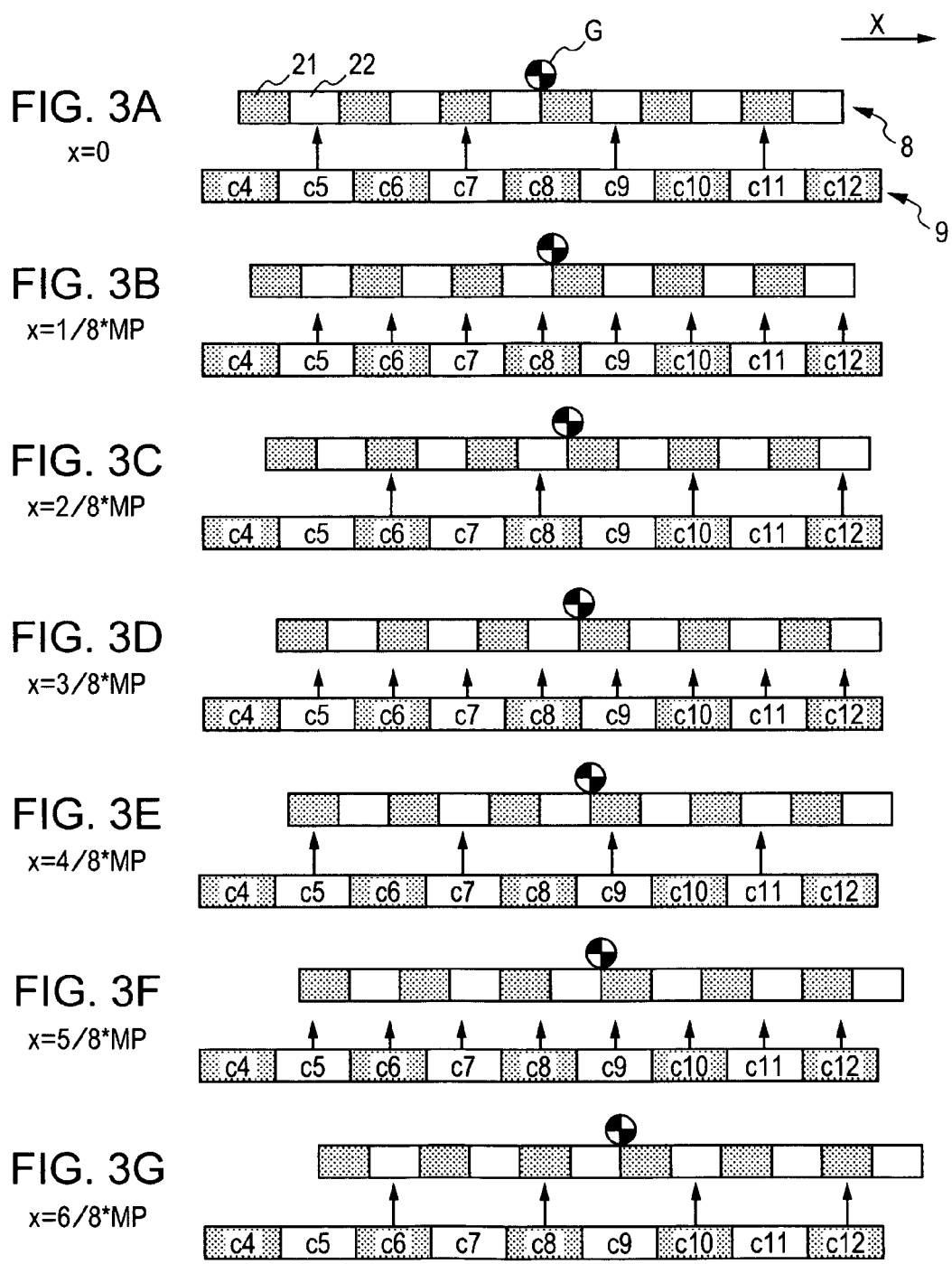
FIGS. 3A to 3G show the position and magnitude of the forces in the Z direction generated by coils.

When the stage position x is zero (as shown in FIG. 3A), only the odd-numbered coils (c5, c7, c9, and c11) generate forces in the Z direction. In the case where the center of gravity G of the stage is in the center of the magnet unit 8 shown in FIGS. 3A to 3G, when x is zero, the application points of the forces in the Z direction are symmetrical with respect to the center of gravity G.

When the stage position x is ⅛*MP (as shown in FIG. 3B), the force ratio between the odd-numbered coils (c5, c7, c9, and c11) and the even-numbered coils (c6, c8, c10, and c12) is 1:1. However, in this state, the application points are not symmetrical with respect to the center of gravity G, and a moment is generated in the −θy direction. Therefore, in addition to the forces in FIG. 3B, coils c5 to c12 generate a correction moment to compensate for the −θy moment.

When the stage position x is ⅖*MP (as shown in FIG. 3C), only the even-numbered coils (c6, c8, c10, and c12) generate forces in the Z direction. The coils generate a −θy moment greater than that in the state of FIG. 3B.

When the stage position x is ⅜*MP (as shown in FIG. 3D), the force ratio between the odd-numbered coils (c5, c7, c9, and c11) and the even-numbered coils (c6, c8, c10, and c12) is 1:1, and the θy moment is zero.

When the stage position x is 4/8*MP (as shown in FIG. 3E), only the odd-numbered coils generate forces, and the θy moment is in the positive direction.

When the stage position x is ⅝*MP (as shown in FIG. 3F), the force ratio between the odd-numbered coils and the even-numbered coils is 1:1. However, in this state, the application points are not symmetrical with respect to the center of gravity G, and a moment is generated in the +θy direction. Therefore, in addition to the forces in FIG. 3F, coils c5 to c12 generate a correction moment to compensate for the +θy moment.

When the stage position x is 6/8*MP (as shown in FIG. 3G), only the even-numbered coils generate forces, and no θy moment is generated. From the relationship between the magnetic-pole pitch MP and the coil pitch CP, 6/8*MP is equal to CP. That is to say, the state of FIG. 3G can be considered as a state such that the odd-numbered coils in FIG. 3A are replaced with the even-numbered coils. Therefore, when the stage position x moves beyond 6/8*MP, the states of FIGS. 3A to 3G are repeated.

When the center of gravity G shifts due to movement of the stage, and application points of the forces in the Z direction supporting the weight of the stage also change, the forces are unbalanced, and a moment in the θy direction is generated. Although shown separately for purposes of illustration in FIGS. 3A to 3G, of course, these moments really change continuously. In other words, due to movement of the stage, forces in the Z direction are applied to the stage with the positions and balance of the forces continuously changing. The change in the forces in the Z direction creates a resultant force that deforms the stage.

The method for measuring the position of the stage will be described with reference to FIG. 5. The position of the stage 5 in the X direction is measured by irradiating a reflecting mirror 14 provided in the stage 5 with laser light 13 from a laser interferometer (denoted by reference numeral 12 in FIG. 1) and making the laser light 13 reflect from the reflecting mirror 14. Similarly, the position of the stage 5 in the Y direction is measured by irradiating another reflecting mirror provided in the stage 5 with laser light from another laser interferometer (not shown) and making the laser light reflect from the reflecting mirror.

The position of the stage 5 in the θz direction is calculated in the laser interferometer for the X direction or Y direction, using two measurement axes a certain distance apart in the horizontal direction, from the difference between the measurement values and the distance between the measurement axes.

The position of the stage 5 in the Z direction is measured by emitting laser light 16 in the Y direction from a laser interferometer and by making the laser light reflect from a reflecting mirror 15 provided in the stage 5. The reflecting mirror 15 is formed by beveling an edge of the stage at an angle of 45 degrees and mirror-finishing the beveled surface. The reflecting mirror 15 is elongated in the X direction, and therefore the position where the laser light 16 is incident on the reflecting surface can be made the same as the position of the exposure light axis 19 in the X direction.

The laser light reflected by the reflecting mirror 15 is then reflected by a reflecting mirror (not shown) for measuring the position of the stage 5 in the Z direction provided in the lens barrel supporting member. The reflecting mirror for measuring the position of the stage 5 in the Z direction has a reflecting surface perpendicular to the Z direction and is elongated in the Y direction. When the position of the stage 5 changes in the Z direction, the optical path length between the laser interferometer and the reflecting mirror for measuring the position of the stage 5 in the Z direction changes. When the stage 5 moves in the Y direction, the optical path length also changes. Therefore, the measurement value in the Z direction is obtained by subtracting the measurement value in the Y direction from the measurement value of the laser interferometer for the Z direction.

The positions of the stage 5 in the θx and θy directions are calculated in the laser interferometers for the X direction and the Y direction respectively, using two measurement axes a certain distance apart in the vertical direction, in the same way as in the case of the θz axis.

Although the reflecting mirror 15 provided in the stage 5 is slanted in this example, alternatively, a reflecting surface perpendicular to the Z direction may be provided in the stage 5. In this case, the laser interferometer irradiates the stage 5 with laser light from the Z direction. For this purpose, for example, the reflecting surface of the reflecting mirror for measuring the position of the stage 5 in the Z direction provided in the lens barrel supporting member is slanted. Providing a stage with a reflecting surface perpendicular to the Z direction is discussed in Japanese Patent Laid-Open No. 2002-319541 (corresponding to U.S. Pat. No. 6,819,433).

Next, deformation of the stage 5 will be described. The degree of curving deformation of the stage on which a wafer is mounted is shown by α. As described above, the position of the stage 5 is measured with the laser interferometer 12, and therefore the displacement of the reflecting mirror 14 provided on the side surface of the stage 5 is measured. The rigidity of the wafer chuck (not shown) and the wafer 7 is lower than the rigidity of the stage 5, and the wafer chuck and the wafer 7 are vacuum-attracted to the stage 5. Therefore, the surface shape of the wafer 7 follows the surface shape of the stage 5. If the degree α of curving deformation changes, the distance L between the reflecting mirror 14 and the exposure position changes. This change in the distance L causes deterioration of measurement accuracy, and consequently deteriorates exposure accuracy.

In this embodiment, the position in the X direction of the laser light 16 for measuring the position of the stage 5 in the Z direction is the same as that of the exposure light axis 19. Therefore, if any curving deformation occurs, the measurement value of the stage position in the Z direction is not affected.

Figure 6:
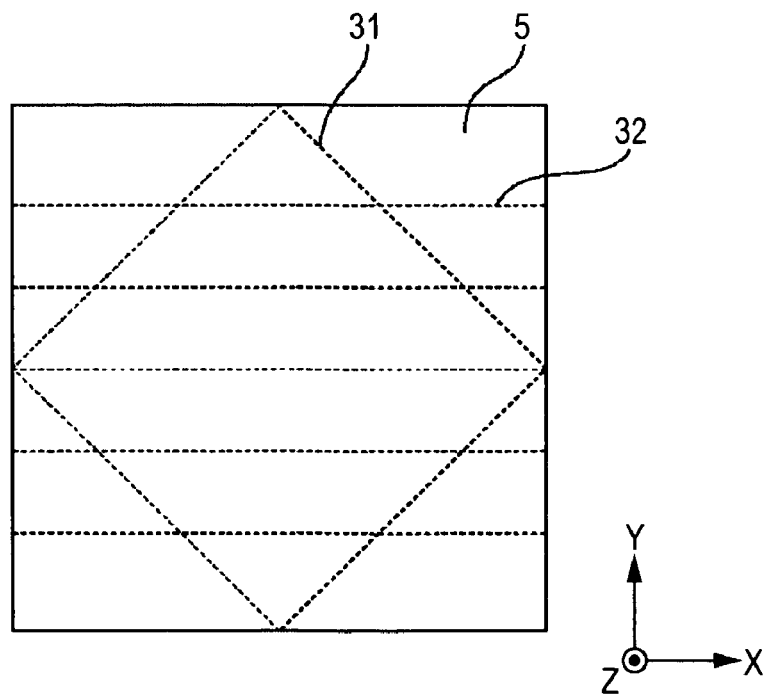
FIG. 6 shows ribs of the stage.

FIG. 6 shows the rib configuration of the wafer stage 5 in FIG. 1. The stage should be lightweight and have high rigidity. If the mass of the stage is large, a great force is required to accelerate and decelerate the stage. Therefore, a large amount of energy is applied to the surface motor. In addition, a large amount of heat is generated in the stator coil. If this heat is transferred to the stage, thermal expansion causes a change in the positional relationship between the laser interferometer and the exposure position, and deteriorates the exposure accuracy.

In order to achieve positioning control in the high bandwidth, it is necessary to increase the elastic-mode natural frequency of the stage structure. The reason is that the elastic-mode vibration of the stage structure is transferred to the position measurement signal through the reflecting mirror for the laser interferometer, and if high feedback gain is used, the stage structure can oscillate. When the elastic-mode natural frequency is high, even if the frequency component of the elastic-mode natural frequency appears in the position measurement signal, the influence on the feedback control system can be reduced using a lowpass filter or notch filter. In order to realize a lightweight and highly rigid stage structure, a hollow rib structure using a ceramic material is used. In order to increase the natural frequency, as shown in FIG. 6, the square stage structure is provided with a rhombus-shaped rib 31.

Figure 5:
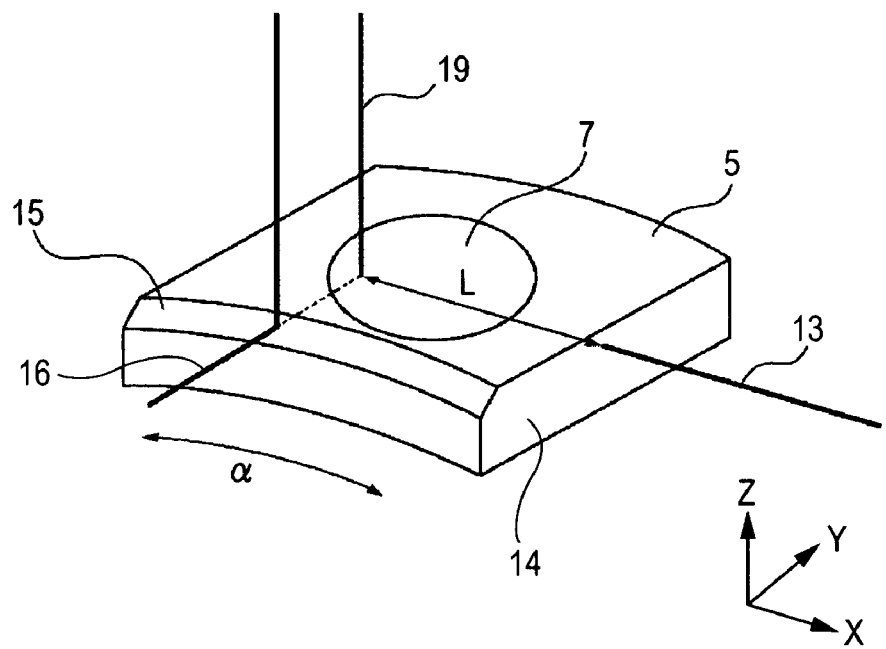
FIG. 5 shows how the stage is deformed.

In addition, in the present invention, in order to increase the rigidity of the stage 5 in the direction in which the curving deformation occurs as shown in FIG. 5, ribs 32 parallel to the Y direction are provided. The ribs 32 parallel to the Y direction are, that is to say, ribs parallel to the direction in which the application points of the forces supporting the weight of the stage 5 shift when the stage is moved. By providing such ribs 32, if the positions and balance of the forces in the Z direction change due to movement of the stage 5 in the X direction, the change in the degree α of curving deformation shown in FIG. 5 can be reduced.

Figure 7:
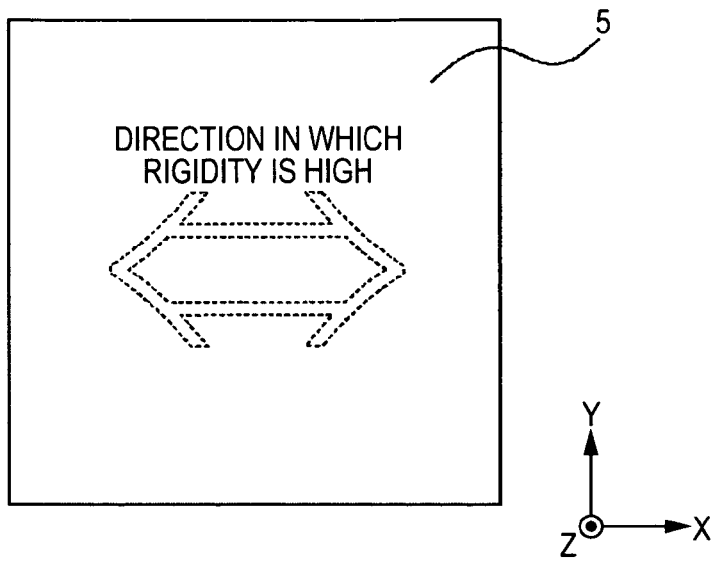
FIG. 7 shows the rigidity of the stage.

FIG. 7 shows a modification of embodiment 1. Recently, in order to further reduce the weight of a stage structure, FRP (fiber-reinforced plastic) materials have been used. In FRP materials, rigidity depends on the bending direction due to the orientation of the fibers. In FIG. 7, the rigidity is reinforced in the direction of the arrow. FIG. 7 shows a stage 5 in which the change in the degree a of curving deformation is reduced by using a material having anisotropic rigidity and by increasing the bending rigidity in the X direction. In addition, since the position in the X direction of the laser light for measurement of the position of the stage 5 in the Z direction is the same as that of the exposure light axis, if any deformation of the stage structure occurs, the measurement value of the stage position in the Z direction is not affected.

Figure 8:
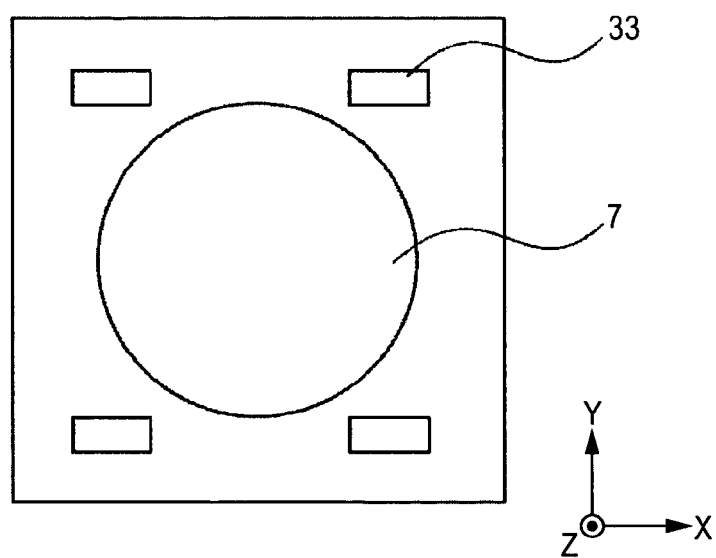
FIG. 8 shows piezoelectric element actuators.

Since high exposure accuracy is required, just reinforcing the rigidity in the bending direction of the stage structure cannot meet the requirement for photolithography machines. In such a case, as shown in FIG. 8, actuators 33 using a piezoelectric element are provided on the top surface of the stage structure. Since the wafer chuck is placed in the center of the stage structure, the piezoelectric element actuators are disposed around the center of the stage structure. Both ends in the X direction of each piezoelectric element actuator are attached to the stage structure. By adjusting the voltage applied to the piezoelectric element actuators, the piezoelectric element actuators can expand and contract in the X direction. Therefore, a bending force counteracting the curving deformation shown in FIG. 5 can be generated. By adjusting the voltage applied to the piezoelectric element actuators depending on the stage position, the degree a of curving deformation can be reduced to such a degree that there is no problem with the exposure accuracy.

Figure 9:
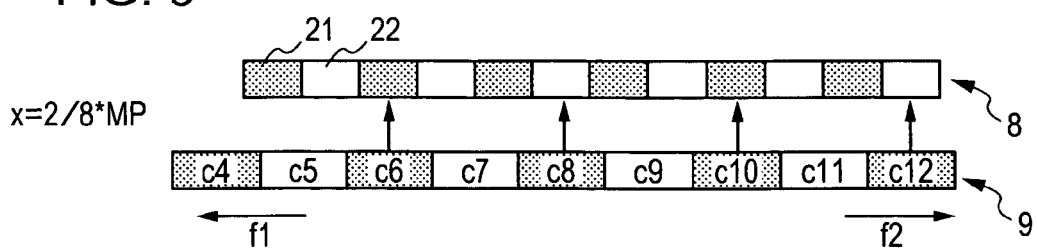
FIG. 9 illustrates the curve-correcting forces.

FIG. 9 illustrates the curve-correcting forces in the state of FIG. 3C. At this time, all forces in the horizontal direction are generated by the odd-numbered coils. In addition to the control forces generated for positioning, the coils c5 and c11 generate the curve-correcting forces f1 and f2, respectively. In this surface motor, a force is generated in the center of each coil. By generating the forces f1 and f2 shown in FIG. 9 with the coils c5 and c11, a bending force to compensate for the curving deformation shown in FIG. 5 can be applied to the stage structure through the movable magnets. Since the forces f1 and f2 have the same magnitudes and opposite directions, the resultant force in the X direction is zero. The correcting forces are adjusted depending on the stage position. The coils for generating correcting forces are not limited to the coils shown here. Any coils that generate a bending force to compensate for the curving deformation shown in FIG. 5 can be used.

The methods for obtaining the command value of the voltage applied to the piezoelectric element actuators and the command value of correcting force will be described. The methods for obtaining the command values include a method using an apparatus different from the photolithography machine and a method using the photolithography machine. First, a method using an apparatus different from the photolithography machine will be described.

Figure 10:
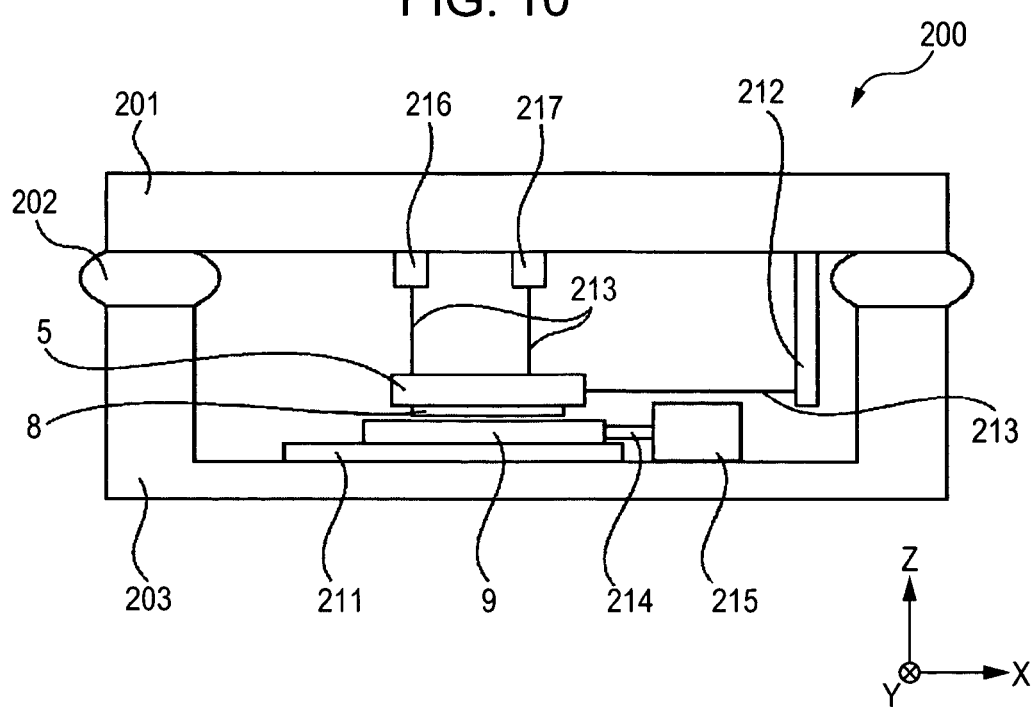
FIG. 10 shows an apparatus for obtaining the command value to be sent to the piezoelectric element actuators.
Figure 11:
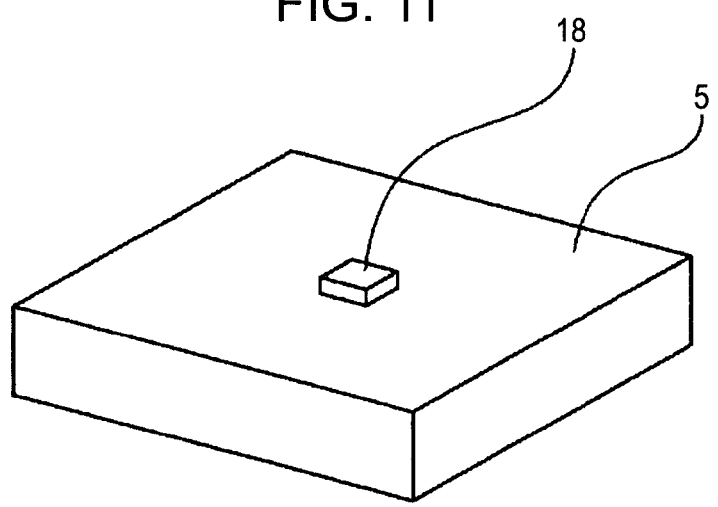
FIG. 11 shows a mirror for measuring deformation.

FIGS. 10 and 11 show an apparatus for obtaining the command value to be sent to the piezoelectric element actuators. An apparatus 200 includes a stage structure, a mirror 18 for measuring deformation provided on the stage structure, a coil unit (stator) 9, a laser interferometer 212 for measuring the position of the stage 5 in six directions, and a measuring plate 201 on the underside of which the laser interferometer 212 is attached. The measuring plate 201 is mounted on a mount 203. The measuring plate 201 is insulated with a vibration absorber 202 to insulate against vibrations from the floor. Since the mechanism for positioning the stage is almost the same as that described in FIG. 1, only the difference will be described.

The coil unit 9 can move in the X direction along the guide 211 provided in the mount 203. The coil unit 9 is moved by a ball screw 215. The force of the ball screw 215 is transferred to the coil unit 9 by a drive shaft (drive mechanism) 214. Incidentally, the drive mechanism is not limited to this configuration.

The position of the coil unit 9 in the X direction is measured with an instrument (not shown), for example, a linear encoder. For the positional servo of the stage 5, positional relationship information between the stage 5 and the coil unit 9 is used. This positional relationship information is obtained from the measurement value of another laser interferometer 216 and the measurement value of the above-mentioned instrument.

In addition to the laser interferometer 216 used for positional servo, yet another laser interferometer 217 for measuring the deformation of the stage is provided in the measuring plate 201. The measurement light 213 emitted from the laser interferometer 217 are reflected by the mirror 18 for measuring deformation provided on the stage 5. The laser interferometer 217 can move in the XY direction. The mirror 18 for measuring deformation moves in response to the movement of the laser interferometer 217.

The method for obtaining the command value to be sent to the piezoelectric element actuators 33 using the above-described apparatus will be described. First, the stage 5 is positioned at a predetermined target position using a servomechanism. At this time, the command value of the voltage applied to the piezoelectric element actuators 33 in FIG. 8 or the correction command value of FIG. 9 is zero. Next, with the stage 5 positioned, the coil unit 9 is moved with the drive mechanism, and the output of the laser interferometer 217 is recorded.

Here, the coil unit 9 needs only be moved by one coil pitch. The reason is that the cycle of the change of the forces in the Z direction accompanying the movement of the stage 5 is one coil pitch. By moving not the stage 5 but the coil unit 9, the position where the measurement light of the laser interferometer 217 is incident on the reflecting surface can be fixed. If the stage is moved, the irradiation position of the measurement light changes, and therefore measurement is affected by the surface accuracy and the installation error of the reflecting mirror.

Next, the average value of the recorded output of the laser interferometer 217 is calculated. The coil unit 9 is returned to the initial position and is then moved again. In this movement operation, a voltage command value is given to the piezoelectric element actuators 33 or a correction command value is given to the coil unit 9 so that the output of the laser interferometer 217 approaches the calculated average value. The voltage command value and the correction command value can be adjusted.

By repeating these adjustments and slight displacement of the coil unit 9, a table of command values concerning the positional relationship between the coil unit 9 and the stage 5 can be obtained. In order to make the table more reliable, the values in the table can be modified by changing the position of the mirror 18 for measuring deformation and by performing the same measurement.

Next, the method for obtaining the command value to be given to the piezoelectric element actuators 33 using the photolithography machine will be described. Around the projection optical system 4 in FIG. 1, an alignment optical system (not shown) and a focus detecting system (not shown) are provided. The alignment optical system measures the position of an alignment mark provided on the wafer, thereby detecting displacement of the alignment mark with respect to the projection optical system 4.

First, the stage 5 is positioned using a servomechanism at a position where the alignment mark can be measured, and the position of the alignment mark is measured with the alignment optical system. Next, with the stage 5 positioned, the coil unit 9 is moved with a drive mechanism and the position of the alignment mark is measured. A voltage command value is given to the piezoelectric element actuators 33 or a correction command value is given to the coil unit 9 so that the displacement of the alignment mark is reduced. The voltage command value and the correction command value can be adjusted.

By repeating these adjustments and slight displacement of the coil unit 9, a table of command values concerning the positional relationship between the coil unit 9 and the stage 5 can be obtained.

The focus detecting system can detect the height in the Z direction of the wafer surface. Therefore, by referring to this value, a more accurate correction command value can be obtained. In this way, also in the photolithography machine, a table of command values concerning the positional relationship between the coil unit 9 and the stage 5 can be obtained.

By controlling the piezoelectric element actuators 33 or the coil unit 9 using the above-described table of correction command values, the bending force exerted on the stage 5 due to the change in the application points of forces can be reduced.

Figure 12:
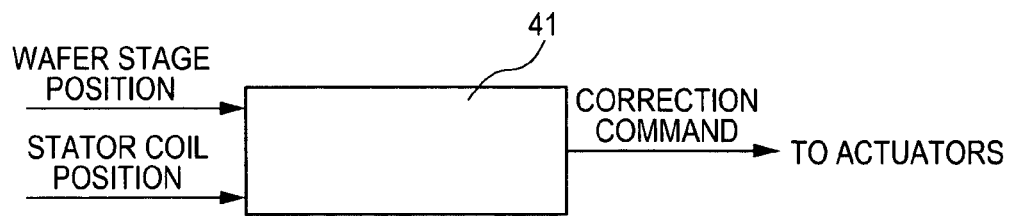
FIG. 12 is a block diagram of a correcting system using piezoelectric element actuators.

FIG. 12 is a block diagram of the above-described correction system using piezoelectric element actuators 33. The positional information of the stage 5 and the coil unit 9 is input into a control unit 41, and the control unit 41 outputs a correction command value. The control unit 41 has the above-described correction-command-value table in the memory. The positional relationship between the stage 5 and the coil unit 9 is a continuous value. In the case where the correction-command-value table has discrete values, it is necessary to interpolate the values in order to obtain a correction command value from the correction-command-value table. As the method for interpolation, a commonly used method such as an approximation method may be used.

The correction command value is sent to the piezoelectric element actuators 33 or the coil unit 9. The correction command value varies depending on the type of actuator used for correction. Therefore, the correction-command-value table is tailored to the actuator to be used.

In addition, by adjusting the command value to be sent to the stage using the above-described correction-command-value table, the bending force exerted on the stage can be reduced.

Figure 13:
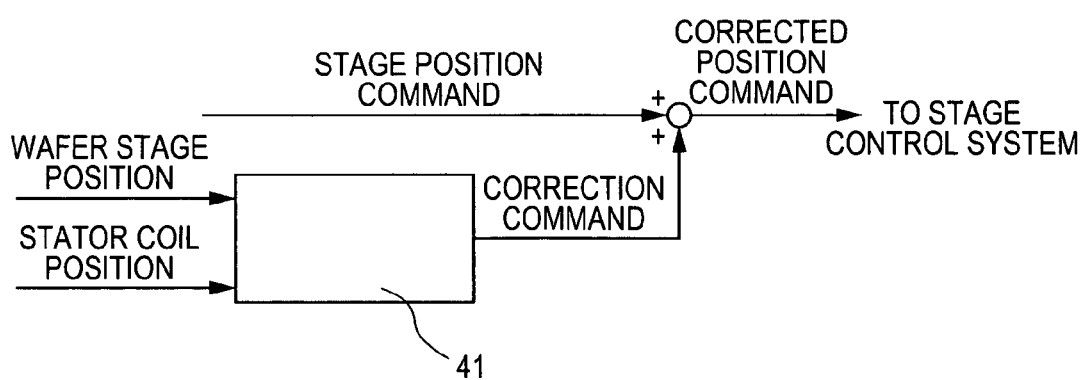
FIG. 13 is a block diagram of a correcting system using a stage position command.

FIG. 13 is a block diagram of a correction system using a stage position command. This correction command value can be obtained using the above-described method for making the correction-command-value table on the photolithography machine. When exposure is performed, a stage position command is corrected using a correction command obtained from the correction-command-value table, and the corrected position command is sent to the stage control system. That is to say, the amount of wafer displacement caused by the stage deformation due to the change in the positional relationship between the stator and mover is calculated, the stage is positioned in consideration of the amount of displacement, and consequently exposure can be performed at the correct position.

Figure 14:
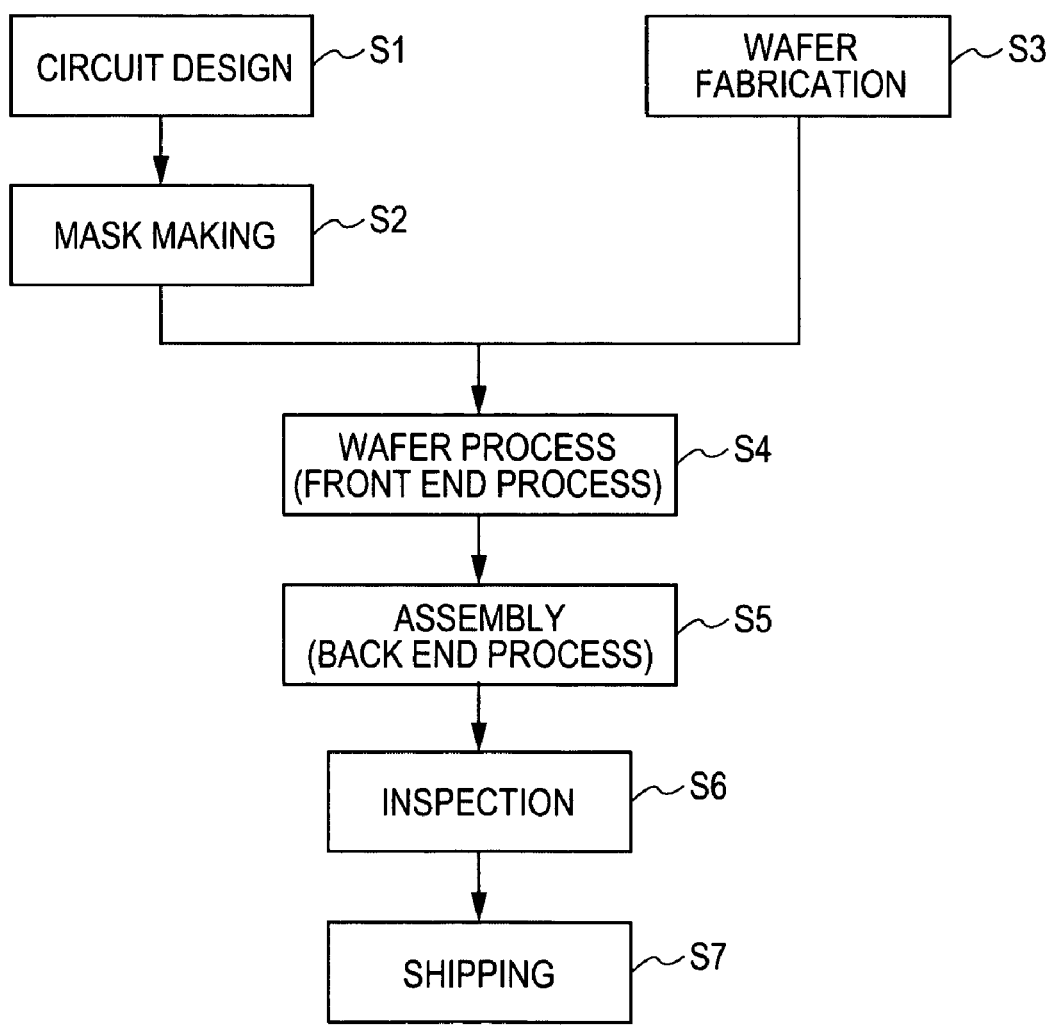
FIG. 14 shows a device-manufacturing method.

Next, a process of manufacturing semiconductor devices using this photolithography machine will be described. FIG. 14 shows the flow of the whole manufacturing process of semiconductor devices. In step S1 (circuit design), a semiconductor device circuit is designed. In step S2 (mask making), a mask is made on the basis of the designed circuit pattern.

In step S3 (wafer fabrication), wafers are fabricated using a material such as silicon. Step S4 (wafer process) is called a front end process. In step S4, actual circuits are formed on the wafers by lithography using the mask and the photolithography machine. Step S5 (assembly) is called a back end process. In step S5, semiconductor chips are made of the wafers processed in step S4. The back end process includes an assembly process (dicing and bonding) and a packaging process (chip encapsulation). In step S6 (inspection), inspections such as an operation confirmation test and a durability test of the semiconductor devices made in step S5 are conducted. Through this process, the semiconductor devices are completed and shipped in step S7.

The wafer process of step S4 includes the following steps. An oxidation step in which the surface of a wafer is oxidized. A Chemical Vapor Deposition (CVD) step in which an insulating film is formed on the wafer surface. An electrode formation step in which electrodes are formed on the wafer by vapor deposition. An ion implantation step in which ions are implanted in the wafer. A resist process step in which a photosensitive material is applied to the wafer. An exposure step in which the circuit pattern is transferred to the wafer with the photolithography machine. A development step in which the exposed wafer is developed. An etching step in which the wafer is etched except for the developed resist image. A resist stripping step in which the resist is removed. These steps are repeated, and multilayer circuit patterns are formed on the wafer.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2005-033017 filed Feb. 9, 2005, which is hereby incorporated by reference herein in its entirety.

What is claimed is:

1. A positioning apparatus having a surface motor, comprising:
   a moving member including a magnet unit having a cyclic magnetic-flux-density distribution along a first direction parallel to a predetermined plane;
   a coil unit including a plurality of coils arranged along the first direction in a pitch corresponding to the cyclic magnetic-flux-density distribution; and
   a controller configured to apply a cyclic current corresponding to a position of the moving member in the first direction to at least two out of the plurality of coils at different phases and apply a force at least perpendicular to the plane to the magnetic unit,
   wherein a bending rigidity of the moving member in the first direction is greater than a bending rigidity of the moving member in a second direction parallel to the predetermined plane and perpendicular to the first direction, and
   wherein the plurality of coils support the weight of the moving member and the second direction is a longitudinal direction.

2. An exposure apparatus comprising the positioning apparatus according to claim 1.

* * * * *